United States Patent
Eckrich et al.

(10) Patent No.: US 9,651,586 B2
(45) Date of Patent: May 16, 2017

(54) METHOD AND CIRCUIT FOR CHECKING THE PLAUSIBILITY OF A CURRENT SENSOR MEASUREMENT RESULT

(71) Applicant: Continental Teves AG & Co. OHG, Frankfurt (DE)

(72) Inventors: Jörg Eckrich, Wiesbaden (DE); Wolfgang Jöckel, Gersfeld (DE); Klaus Rink, Rodenbach (DE); Martin Haverkamp, Frankfurt (DE); Torsten Martin, Steinbach/Taunus (DE); Jens Herchenröder, Brachttal-Udenhain (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 45 days.

(21) Appl. No.: 14/426,515

(22) PCT Filed: Sep. 5, 2013

(86) PCT No.: PCT/EP2013/068407
§ 371 (c)(1),
(2) Date: Mar. 6, 2015

(87) PCT Pub. No.: WO2014/037465
PCT Pub. Date: Mar. 13, 2014

(65) Prior Publication Data
US 2015/0219696 A1   Aug. 6, 2015

(30) Foreign Application Priority Data

Sep. 7, 2012   (DE) .................. 10 2012 215 946

(51) Int. Cl.
*G01R 19/00* (2006.01)
*G01R 35/00* (2006.01)
(Continued)

(52) U.S. Cl.
CPC ....... *G01R 19/0092* (2013.01); *G01R 31/006* (2013.01); *G01R 35/00* (2013.01); *G01R 1/203* (2013.01)

(58) Field of Classification Search
CPC .. G01R 31/005; G01R 31/006; G01R 31/008; G01R 19/00; G01R 19/30; G01R 21/06
(Continued)

(56) References Cited

U.S. PATENT DOCUMENTS 3,555,476 A * 1/1971 Brenner ................. G01R 27/18
336/175
6,288,507 B1 * 9/2001 Makino ..................... H02P 7/04
318/292

(Continued)

FOREIGN PATENT DOCUMENTS

CN   2758789   2/2006
CN   201188127  1/2009
(Continued)

OTHER PUBLICATIONS

German Search Report mailed May 10, 2013 in German Application No. 10 2012 215 946.0, including partial translation.
(Continued)

*Primary Examiner* — Patrick Assouad
*Assistant Examiner* — Demetrius Pretlow
(74) *Attorney, Agent, or Firm* — RatnerPrestia

(57) ABSTRACT

A method for checking the plausibility of a measurement result for an electric current by a current sensor connected to an electrical circuit, the method including: making a predetermined change to the switching state of the electrical circuit; detecting, by the current sensor, a change to the electric current resulting from the change to the switching state as a measurement result; and checking the plausibility
(Continued)

of the measurement result by contrasting the change to the switching state and the change to the electric current.

10 Claims, 5 Drawing Sheets

(51) Int. Cl.
*G01R 31/00* (2006.01)
*G01R 1/20* (2006.01)

(58) Field of Classification Search
USPC .............................................. 324/503, 76.11
See application file for complete search history.

(56) References Cited

U.S. PATENT DOCUMENTS

| | | | |
|---|---|---|---|
| 7,005,859 | B2 | 2/2006 | Knecht |
| 8,138,704 | B2 | 3/2012 | Chakrabarti |
| 2003/0184936 | A1* | 10/2003 | Wimmer .............. G01R 31/085 361/87 |
| 2011/0235372 | A1 | 9/2011 | Mohr |
| 2013/0214804 | A1 | 8/2013 | Dietz |
| 2013/0332099 | A1* | 12/2013 | Lai ..................... G01R 19/0053 702/104 |
| 2013/0335100 | A1 | 12/2013 | Boehm |

FOREIGN PATENT DOCUMENTS

| | | |
|---|---|---|
| CN | 101493508 | 7/2009 |
| CN | 101644752 | 2/2010 |
| CN | 101718852 | 6/2010 |
| CN | 101895245 | 11/2010 |
| CN | 101927785 | 12/2010 |
| DE | 10343179 | 4/2005 |
| DE | 102011078548 | 1/2012 |
| DE | 102010041275 | 3/2012 |
| JP | 63082377 A * | 4/1988 |
| JP | 02128964 | 5/1990 |
| JP | 2002139520 | 5/2002 |
| JP | 2007003451 | 1/2007 |
| JP | 2007192723 | 8/2007 |
| JP | 2009100551 | 5/2009 |
| JP | 2010019805 | 1/2010 |
| JP | 2011109852 | 6/2011 |
| WO | 03081263 | 10/2003 |
| WO | 2012001157 | 1/2012 |
| WO | 2012038161 | 3/2012 |

OTHER PUBLICATIONS

International Search Report for International Application No. PCT/EP2013/068407 mailed Dec. 11, 2013.
Japanese Office Action mailed Feb. 29, 2016 in Japanese Application No. 2015-530393, with English translation.
Chinese Office Action for Chinese Application No. 201380046565.7, dated May 16, 2016, including English translation, 18 pages.

* cited by examiner

METHOD AND CIRCUIT FOR CHECKING THE PLAUSIBILITY OF A CURRENT SENSOR MEASUREMENT RESULT

CROSS REFERENCE TO RELATED APPLICATIONS

This application is the U.S. National Phase Application of PCT International Application No. PCT/EP2013/068407, filed Sep. 5, 2013, which claims priority to German Patent Application No. 10 2012 215 946.0. filed Sep. 7, 2012, the contents of such applications being incorporated by reference herein.

FIELD OF THE INVENTION

The invention relates to a circuit for conducting an electric current between a vehicle battery and an electrical network component which is connectable to the vehicle battery via an electrical component, and to a vehicle having the circuit.

SUMMARY OF THE INVENTION

In order to perform measurements of an electric current output by an electrical energy source to an electrical consumer in a motor vehicle, a current sensor can be connected in series between the electrical energy source and the electrical consumer. A current sensor of this type is known, for example, from DE 10 2011 078 548 A1 being incorporated by reference herein.

The problem addressed by the present invention is to improve known current measurement methods.

According to one aspect of the invention, a method for checking the plausibility of a measurement result of a current sensor interconnected in an electrical circuit comprises the following steps:
  making a predetermined change to the circuit state of the electrical circuit;
  detecting a change in the electric current which is brought about by the change in the circuit state; and
  checking the plausibility of the measurement result of the current sensor by comparing the change in the circuit state and the change in the electric current.

The specified method is based on the consideration that current sensors should be electrically connected in series between the electrical energy source and the electrical consumer in order to route the entire electric charge to be transported by the electric current via the current sensor. On the basis of this consideration, the specified method is based on the discovery that defects in the electrical circuit in which the current sensor is implemented, or defects in the current sensor itself, such as parasitic short circuits, for example, can lead to some of the electric current and hence some of the electric charge being conducted past the current sensor and not being able to be detected by the current sensor, which leads to an erroneous measurement by the current sensor. In order to avoid an erroneous measurement such as this, it is proposed with the specified method to transfer the electrical circuit into such a state in which the electric current is known or can at least be derived from the state. Thus, it is possible to ensure fault-free functioning of the current sensor in the electric circuit.

In a development, the specified method comprises the step of connecting a known electrical consumer to the circuit in order to make the predetermined change to the circuit state of the electrical circuit. If the circuit is, for example, part of an onboard power supply system in a vehicle or is operated in a vehicle as onboard power supply system, said known electrical consumers are, for example, in the form of a heater, an air-conditioning system or the like. The development is based on the consideration that the current itself does not have to be detected, but only the change in said current which is caused by the connection of the known electrical consumer.

In another development of the specified method, the current sensor has at least two parallel-connected shunts wherein, in order to make the predetermined change to the circuit state of the electrical circuit, a shunt is electrically removed from the circuit. This development is based on the consideration that the current sensor can also be monitored for fault-free functionality thereof by the individual parallel-connected shunts, the value of which must have been made known, for example, by the manufacturing process, since when a shunt is disconnected, the current in the other shunt must change in a manner known to a person skilled in the art, which can be appropriately verified.

In an additional development of the specified method, the electrical circuit is in an at least quasi-static state before the electrical consumer is connected. A quasi-static state is intended to be understood below as a state in which the state of the electrical circuit within a predetermined time limit changes only within a predetermined range. In a static state, the state of the electrical circuit would not change at all. In this way, it is possible to ensure that the predetermined change in the circuit state is not superposed by an unknown change in the circuit state, as a result of which the electric current would change in an unknown manner and thus it would not be possible to check the plausibility of the measurement result using the current sensor.

In yet another development of the specified method, the known current consumption of the known electrical consumer is dependent on operating conditions of the electrical circuit and/or of the electrical consumer. This development is based on the consideration that the electrical resistance of the known electrical consumer influences the electric current to be measured. Said electrical resistance is dependent on the operating conditions of the electrical circuit with the current sensor, however. Taking said operating conditions into account in the specified method therefore improves the checking of the plausibility of the measurement result.

In a preferred development, the operating conditions comprise an operating voltage dropping across the known electrical consumer and/or an operating temperature of the known electrical consumer and/or of the circuit. This development is based on the consideration that not all operating conditions have an effect in the same manner on the electrical resistance of the electrical circuit. In order not to unnecessarily complicate the determination of the known current consumption, only the operating conditions which noticeably change the known current consumption, that is to say outside of particular predefinable tolerance values, should therefore have an influence on the known current consumption.

In an alternative development, the specified method comprises the following steps:
  making a second predetermined change to the circuit state of the electrical circuit;
  detecting a second change in the electric current which is brought about by the second change in the circuit state; and
  comparing the change in the circuit state and the change in the electric current.

This development of the specified method is based on the consideration that the first predetermined change in the circuit state could itself be erroneous, too, for example because a defective consumer is connected to the circuit to change the circuit state. The checking of the plausibility of the measurement result could then erroneously be either positive or negative. In order to prevent this case, it is proposed with the development of the specified method to directly or indirectly check the plausibility of the measurement result obtained from the first predetermined change using a further previously known change in the circuit state.

In this case, according to a particular development of the specified method, the second predetermined change to the circuit state of the electrical circuit can be made after the first predetermined change in the circuit state of the electrical circuit as an alternative or in addition to said first predetermined change.

According to another aspect of the invention, a control device is specified, which control device is set up to perform any of the specified methods.

In a development of the invention, the specified control device has a memory and a processor. In this case, the specified method is stored in the memory in the form of a computer program and the processor is provided to execute the method if the computer program is loaded from the memory into the processor.

An aspect of the invention also relates to a computer program with program code means in order to perform all of the steps of any of the specified methods if the computer program is executed on a computer or any of the specified devices.

An aspect of the invention also relates to a computer program product which contains a program code which is stored on a computer-readable data carrier and which performs any of the specified methods if said program code is executed on a data processing device.

According to another aspect of the invention, a vehicle battery comprises
- a battery pole for outputting an electric current to an electrical consumer,
- a current sensor which is connected to the battery pole for detecting the electrical current, and
- one of the specified control devices, which is connected to the current sensor, for checking the plausibility of a measurement result of the current sensor.

BRIEF DESCRIPTION OF THE DRAWINGS

The above-described properties, features and advantages of this invention and the manner in which the invention is achieved become more clearly and unambiguously understood in connection with the following description of the exemplary embodiments, which are explained in more detail in connection with the drawings, in which.

DETAILED DESCRIPTION OF THE PREFERRED EMBODIMENTS

In the Figs., identical technical elements are provided with identical reference signs and are described only once.

Figure 1:
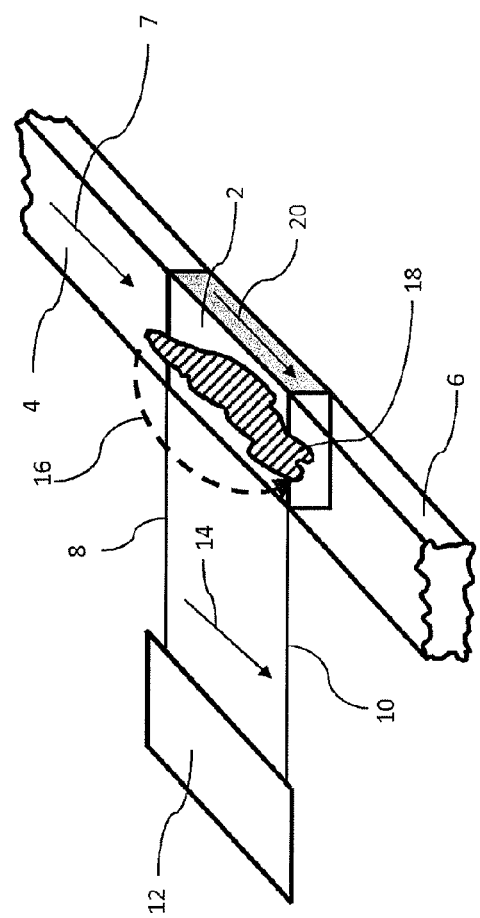
FIG. 1 shows a schematic view of a current sensor between two line sections.

Reference is made to FIG. 1, which shows a schematic view of a current sensor 2 between two line sections 4, 6. An electric current 7 which flows via the current sensor 2 through the two line sections 4, 6 is intended to be detected using the current sensor 2.

In the present embodiment, the current sensor 2 is embodied as passive shunt which, in a manner known to a person skilled in the art, is a simple electrical resistor with a predefined resistance value. However, the current sensor 2 can also be designed as active shunt, as known from DE 10 2011 078 548 A1, for example, or designed on the basis of a magnetic measurement principle and is not restricted in its design in any way.

In the present embodiment, the current sensor 2 is accommodated in abutment between the two line sections 4, 6, wherein electrical measurement lines 8, 10 make electrical contact at the connection points between the line sections 4, 6 and the current sensor 2, which electrical measurement lines are routed to an evaluation circuit 12. A measurement voltage 14 falls between the measurement lines 8, 10 in a manner known to a person skilled in the art. It is possible to deduce, in a manner known to a person skilled in the art, the current 7 to be detected from the measurement voltage 14 and the known resistance value of the current sensor 2 designed as passive shunt.

However, if the current sensor 2 is bridged, for example, by a contaminant 16, some of the current 7 to be detected does not flow via the current sensor 2 but as parasitic current 18 via said contaminant 16, as a result of which the measurement current 20 detected by the current sensor 2 is distorted by said parasitic current 18. Since such contaminants 16 or other defects in the current sensor itself or in a circuit containing the current sensor 2 do not emerge until during the use thereof, these should also be detected during the use thereof. Possible solutions to this are offered below.

Figure 2:
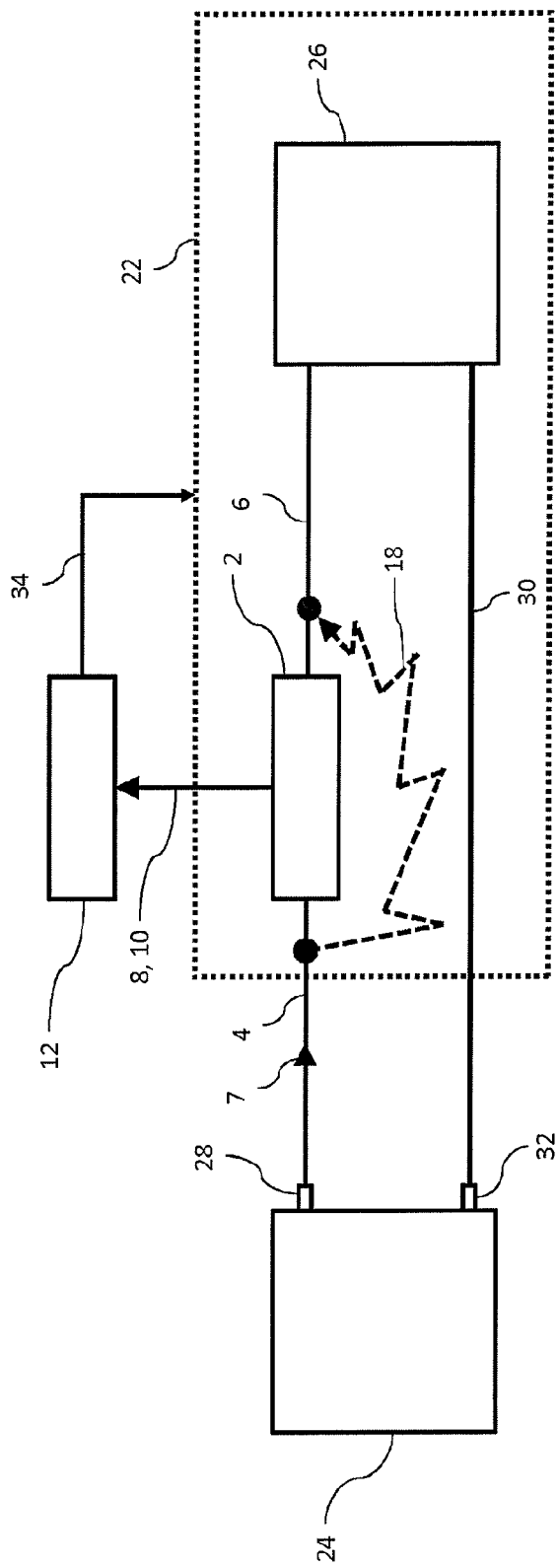
FIG. 2 shows a schematic view of a current sensor in a circuit.

Reference is made to FIG. 2, which shows a schematic view of the current sensor 2 in a circuit 22.

In the present embodiment, the current sensor 2 is connected between an electrical energy source 24, which is embodied as a battery, and an electrical consumer 26, wherein the electric current 7 to be detected is conducted via a first battery pole 28 of the battery 24 and one of the two line sections 4 to the current sensor 2. The current 7 to be detected is then conducted via the other of the two line sections 6 to the electrical consumer 26 and returns from the electrical consumer via a return line 30 and a second battery pole 32 to the battery 24.

The current sensor 2 is connected via measurement lines 8, 10 to the evaluation circuit 12, wherein the measurement lines 8, 10 can transmit the voltage drop 14 across the current sensor 2 but also other signals necessary for measurement, such as a control signal, for example, by means of which the voltage drop 14 can be kept constant in the case of an active shunt. For more information in this regard, reference is made to DE 10 2011 078 548 A1.

In the present embodiment, the evaluation circuit 12 outputs a state change signal 34 by means of which it can change a circuit state of the circuit 22. The circuit state can in this case be any desired influence variable which changes the electric current 7 to be detected. Such influence variables may be, for example, the wiring of the circuit 22 or a temperature acting on the circuit 22 which change the electric current 7 to be detected.

In the present embodiment, the state of the electric circuit 22 is changed by the state change signal 34 such that the electric current 7 to be detected changes in a known manner. Hence, the measurement current 20 flowing via the current sensor 2 and shown in FIG. 1 must also change in the known manner. If it does not, some of the electric current 7 to be detected is flowing via a defect in the circuit 22, such as the contaminant 18, for example, as parasitic current 16, with the result that the measurement current 20 is erroneous. Therefore, the evaluation circuit 12 can check the plausibility of the measurement current 20 detected by the current sensor 2 using the change in the circuit state via the state signal 34.

Two examples relating to this are discussed below.

Figure 3:
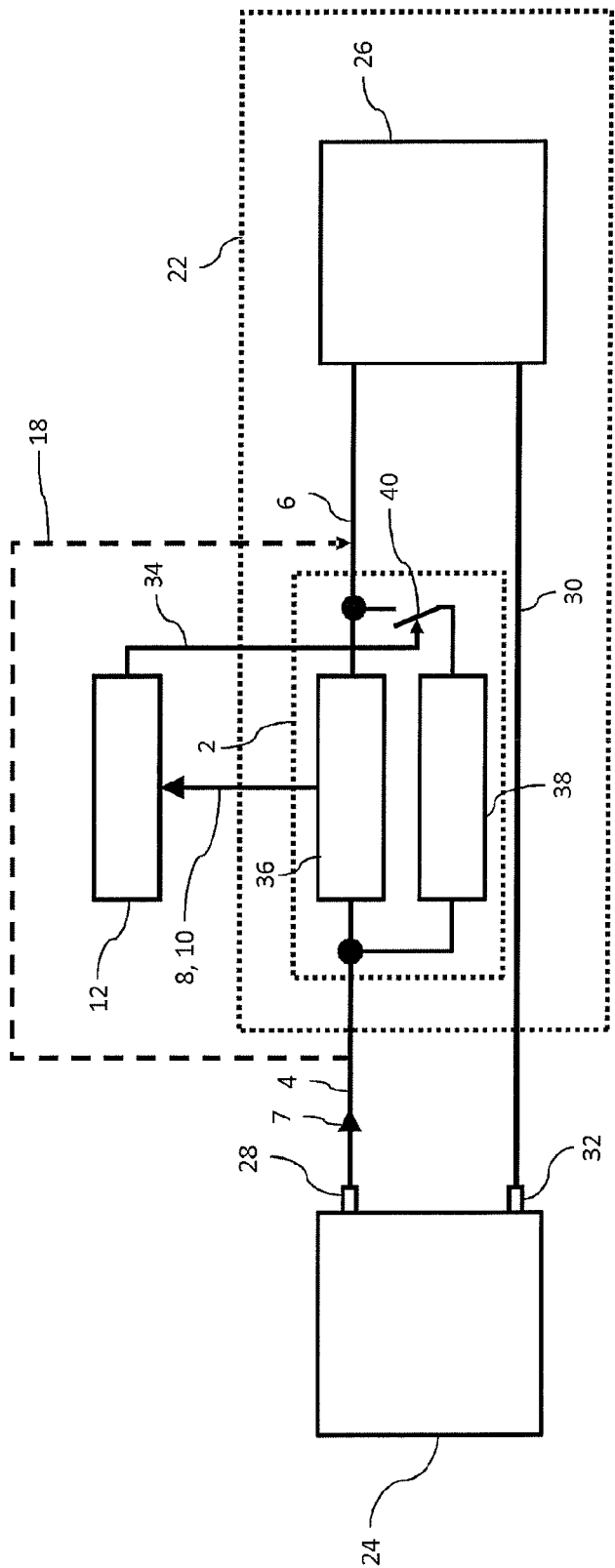
FIG. 3 shows a schematic view of an alternative current sensor in a circuit.

Reference is made to FIG. 3, on the basis of which a first one of the two examples is to be illustrated.

In the present embodiment, the current sensor 2 is constructed from two parallel-connected individual shunts 36, 38, wherein the second individual shunt 38 can be removed from the parallel circuit via a switch 40 which is controllable by the state change signal 34.

During use, the evaluation circuit detects the current 7 to be detected via the measurement current 20 firstly with the two individual shunts 36, 38 in the common parallel circuit and stores the value of the measurement current 20, for example, in an internal memory which is not illustrated in more detail. Then, it isolates the second individual shunt 38 from the parallel circuit using the state change signal 34 and detects the value of the measurement current 20 again.

In the fault-free case, the two detected values now depend on one another in a manner known to a person skilled in the art. If, for example, the resistance values of the two individual shunts 36, 38 are equal in size, the value of the measurement current 20 must be doubled after disconnection of the second individual shunt 38. If it is not, there is a parasitic current 18 flowing.

Figure 4:
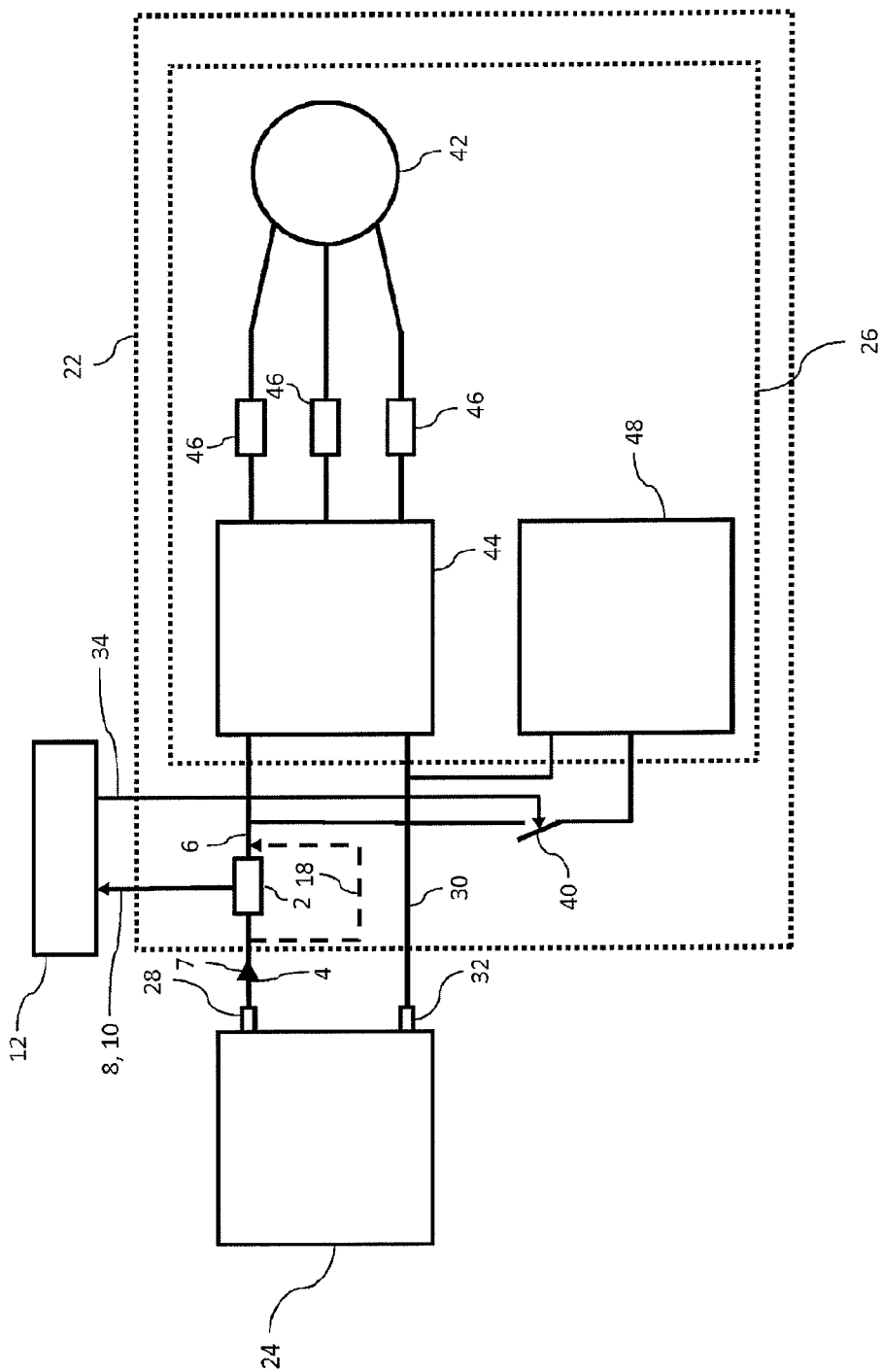
FIG. 4 shows a schematic view of a current sensor in an alternative circuit.

Reference is made to FIG. 4, on the basis of which the second one of the two examples is to be illustrated.

In the second example, it is not the current sensor 2 which is changed, but the electrical consumer 26 connected to the current sensor 2.

For this purpose, the electrical consumer 26 comprises a three-phase electric motor 42, which is supplied with electrical energy from the battery 24 via an inverter 44 in a manner known to a person skilled in the art. In this case, another single-phase current sensor 46 can be arranged in each phase in addition to the current sensor 2 which is already present, in order to perform measurements known to a person skilled in the art, such as detection of the standing magnetic field, for example.

Furthermore, in the present embodiment, an electric heater 48 is connected in parallel with the inverter 44, it being possible for said heater to be isolated from the parallel circuit via the switch 40 which is switchable by means of the state change signal 34.

During use, the evaluation device 12 can connect the electric heater 48 and measure by how much the measurement current 20 through the current sensor 2 has risen. This value must match the current consumption of the electric heater 48. If it does not, some of the current 7 to be detected is flowing as parasitic current 18.

The individual phase current sensors 46 can in this case likewise be checked for fault-free functioning using the method presented in the present application.

Figure 5:
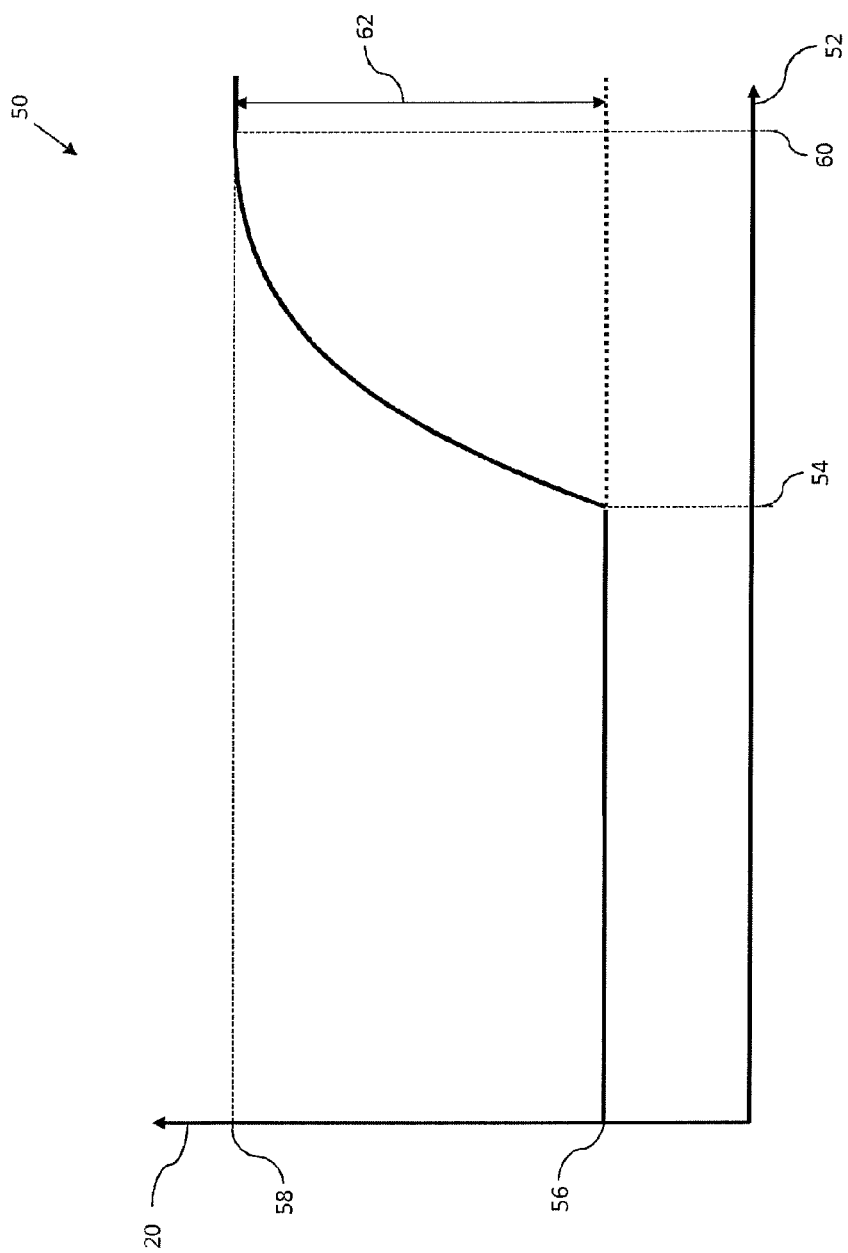
FIG. 5 shows a current profile graph with measurement results from a current sensor.

Reference is made to FIG. 5, which shows a qualitative profile 50 of the measurement current 20 over time 52, which is associated with the arrangement shown in FIG. 4.

Preferably, the electric heater 48 is connected as additional electrical consumer at a start instant 54 when the measurement current 20 has settled to a first static value 56.

After the start instant 54, if the electric heater 48 is connected in parallel with the inverter 44, the measurement current 20 increases and a settles at a second static value 58, which can be measured, at the earliest, at an instant 60 at which said settling process is complete. The duration between said two instants is generally in the order of seconds.

In a normal circuit state of the circuit 22, the magnitude 62 of the difference between the two values 58 and 56 of the measurement current 20 should correspond to the current consumption of the electric heater.

The invention claimed is:

1. A method for checking the plausibility of a measurement result for an electric current by a current sensor including at least two parallel-connected shunts interconnected in an electrical circuit, said method comprising:
   detecting, by the current sensor, as a first measurement result, a first electrical current flowing through the at least two parallel-connected shunts;
   making a first predetermined change to the circuit state of the electrical circuit by disconnecting at least one of the at least two parallel-connected shunts;
   detecting, by the current sensor, as a second measurement result, a second electrical current flowing through one or more of the at least two parallel-connected shunts when the at least one of the at least two parallel-connected shunts is disconnected; and
   checking the plausibility of the measurement result by comparing an expected change in the electric current due to the first predetermined change in the circuit state to the change in the electric current that is given by the first electrical current compared to the second electrical current.

2. The method as claimed in claim 1, comprising connecting a known electrical consumer to the circuit in order to make the first predetermined change to the circuit state of the electrical circuit.

3. The method as claimed in claim 1, wherein the current sensor has at least two parallel-connected shunts and, in order to make the first predetermined change to the circuit state of the electrical circuit, a shunt is electrically removed from the circuit.

4. The method as claimed in claim 2, wherein the electrical circuit is in an at least quasi-static state before the electrical consumer is connected.

5. The method as claimed in claim 2, wherein a result of the comparison between the first change in the circuit state and the change in the electric current is dependent on operating conditions of the electrical circuit and/or of the electrical consumer.

6. The method as claimed in claim 5, wherein the operating conditions comprise an operating voltage dropping across the known electrical consumer and/or an operating temperature of the known electrical consumer and/or of the circuit.

7. The method as claimed in claim 1, comprising:
   making a second predetermined change to the circuit state of the electrical circuit;
   detecting a second change in the electric current which is brought about by the second change in the circuit state; and
   comparing the change in the circuit state and the change in the electric current.

8. The method as claimed in claim 7, wherein the second predetermined change to the circuit state of the electrical circuit is made after the first predetermined change in the circuit state of the electrical circuit as an alternative or in addition to said first predetermined change.

9. A control system which is set up to perform a method for checking the plausibility of a measurement result for an electric current, the system comprising:
- a current sensor including at least two parallel-connected shunts interconnected in an electrical circuit configured to detect a first electrical current flowing through the at least two parallel-connected shunts; and
- an evaluation device configured to:
  - receive a first measurement result of the first electrical current flowing through the at least two parallel-connected shunts detected by the current sensor;
  - make a first predetermined change to the circuit state of the electrical circuit by disconnecting at least one of the at least two parallel-connected shunts;
  - receive a second measurement result of a second electrical current flowing through one or more of the at least two parallel-connected shunts detected by the current sensor, when the at least one of the at least two parallel-connected shunts is disconnected; and
  - check the plausibility of the measurement result by comparing the an expected change in the electric current due to the first predetermined change in the circuit state to the change in the electric current that is given by the first electrical current compared to the second electrical current.

10. A method for checking the plausibility of a measurement result for an electric current by a current sensor including a shunt interconnected in an electrical circuit, said method comprising:
- connecting a known electrical consumer to the circuit in order to make a first predetermined change to the circuit state of the electrical circuit;
- detecting, by the current sensor, as a measurement result, a change in the electric current which is brought about by the first change in the circuit state; and
- checking the plausibility of the measurement result by comparing an expected change of the electric current due to the first change in the circuit state to the change in the electric current,
- wherein the circuit is operated in a vehicle as onboard power supply system, and said known electrical consumers include at least one of a heater or an air-conditioning system, and
- wherein the change in said current which is caused by the connection of the known electrical consumer is detected.

* * * * *